United States Patent
Bonaguide

(10) Patent No.: US 11,619,662 B1
(45) Date of Patent: Apr. 4, 2023

(54) MEASUREMENT SYSTEM AND METHOD FOR A PARALLEL MEASUREMENT WITH MULTIPLE TONES

(71) Applicant: Rohde & Schwarz GmbH & Co. KG, Munich (DE)

(72) Inventor: Greg Bonaguide, Columbia, MD (US)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/478,313

(22) Filed: Sep. 17, 2021

(51) Int. Cl.
  *G01R 29/08* (2006.01)
  *G01R 31/28* (2006.01)

(52) U.S. Cl.
  CPC ..... *G01R 29/0878* (2013.01); *G01R 29/0814* (2013.01); *G01R 31/2841* (2013.01)

(58) Field of Classification Search
  CPC ............ G01R 29/0878; G01R 29/0814; G01R 31/2841
  USPC .......................................................... 324/95
  See application file for complete search history.

(56) References Cited

U.S. PATENT DOCUMENTS

| | | | | |
|---|---|---|---|---|
| 8,841,923 B1 * | 9/2014 | Vanwiggeren | ..... | G01R 19/0053 324/606 |
| 8,842,771 B2 * | 9/2014 | Da Silva | ................ | H04B 17/11 375/296 |
| 9,735,900 B2 * | 8/2017 | VanWiggeren | .... | H04B 17/0085 |
| 10,284,257 B2 * | 5/2019 | Maxson | ................. | H04N 17/00 |
| 10,454,600 B2 * | 10/2019 | Leibfritz | .............. | H04B 17/364 |
| 10,958,362 B1 * | 3/2021 | Owen | .................. | H04B 17/364 |
| 2011/0288820 A1 * | 11/2011 | Bednorz | ................ | H04B 3/462 702/176 |
| 2013/0054178 A1 * | 2/2013 | Land | ...................... | G01R 27/28 702/109 |
| 2013/0163512 A1 * | 6/2013 | Rexberg | ............. | H04L 27/2624 370/328 |
| 2017/0111127 A1 * | 4/2017 | VanWiggeren | .... | H04B 17/0085 |
| 2019/0310299 A1 * | 10/2019 | Kang | ................. | G01R 29/0892 |

* cited by examiner

*Primary Examiner* — Christopher P McAndrew
(74) *Attorney, Agent, or Firm* — Ditthavong, Steiner & Mlotkowski

(57) ABSTRACT

The present disclosure relates to a measurement system for a parallel measurement with multiple tones, comprising: an RF signal source being configured to generate a continuous wave, CW, signal having at least two CW tones, the RF signal source being configured to feed said CW signal to an output port of the system which is arranged for being connected to a device-under-test, DUT; an input port being arranged to receive a response signal from the DUT, the response signal having at least two tones which are based on the at least two CW tones; a conversion unit being configured to convert the response signal to an intermediate frequency, IF, signal by means of analog mixing, thereby converting the at least two tones of the response signal to at least two IF tones; an analog-to-digital converter being configured to convert the IF signal to a digital signal; a parallel processing unit being configured to isolate the at least two IF tones of the IF signal using a digital down conversion, DDC, technique; the parallel processing unit being further configured to perform a measurement on the at least two CW tones and the at least two IF tones to determine at least one scattering parameter of the DUT.

12 Claims, 5 Drawing Sheets

MEASUREMENT SYSTEM AND METHOD FOR A PARALLEL MEASUREMENT WITH MULTIPLE TONES

TECHNICAL FIELD

The present disclosure relates to testing RF systems and components. In particular, the present disclosure relates to a measurement system and a measurement method which are capable of performing parallel measurements with multiple tones.

BACKGROUND ART

RF (radio frequency) equipment, such as signal amplifiers or passive components, can be tested by supplying them with signals of different tones, i.e. different frequencies, and analyzing how these tones are modified or distorted by the equipment. For example, a spectrum analyzer connected to the RF equipment can be used to perform this analysis.

A known testing technique is the so-called two-tone testing. Thereby, two signal tones are generated simultaneously by two separate signal generators and combined, e.g. using a coupler. The combined signal is then supplied to the equipment under test. However, often various two-tone tests at different frequencies, i.e. using different tones, need to be performed consecutively in order to accurately characterize and test an RF equipment. This approach, however, can be cumbersome and slow and, thus, represents a speed bottleneck of a testing procedure.

SUMMARY

Thus, there is a need to provide an improved measurement system and an improved measurement method for testing DUTs. In particular, the above-mentioned disadvantages should be avoided.

According to a first aspect, the present disclosure relates to a measurement system for a parallel measurement with multiple tones, comprising: an RF signal source being configured to generate a continuous wave, CW, signal having at least two CW tones, the RF signal source being configured to feed said CW signal to an output port of the measurement system which is arranged for being connected to a device-under-test, DUT; an input port being arranged to receive a response signal from the DUT, the response signal having at least two tones which are based on the at least two CW tones; a conversion unit being configured to convert the response signal to an intermediate frequency, IF, signal by means of analog mixing, thereby converting the at least two tones of the response signal to at least two IF tones; an analog-to-digital converter being configured to convert the IF signal to a digital signal; a parallel processing unit being configured to isolate the at least two IF tones of the IF signal using a digital down conversion, DDC, technique; the parallel processing unit being further configured to perform a measurement on the at least two CW tones and the at least two IF tones to determine at least one scattering parameter of the DUT.

This achieves the advantage that the time required to test and/or characterize a DUT can be greatly reduced by performing measurements on the DUT with multiple tones in parallel.

The tones can be RF signals or signal components which have a defined frequency and narrow bandwidth. In particular, each tone is a sinusoidal signal, which has a defined amplitude, phase and frequency. For instance, each IF tone can be based on at least one CW tone. The IF tones can have a lower frequency than the respective tones of the response signal due to the down conversion by the conversion unit.

In particular, since at least two tones are calculated for the DDS, the measurement system can have an ideal model of the tones and can use this model (either in it's time domain or FFT-converted frequency domain representation) as the reference signal against which the response signal (in form of the IF signal) is compared for measuring s-parameters for each of the two (or more) tones by means of the parallel processing unit.

Additionally, a reference clock and/or ADC converters can be used for the RF signal source to ensure phase coherence between the RF signal and the response signals. Alternatively, the composite RF signal source can be sampled and down-converted to a further IF signal by means of analog mixing in a manner similar to the response signal.

The DUT can be an active DUT, such as a signal amplifier or power amplifier, or a passive DUT, such as a connector. The DUT can be a non-linear DUT, which causes harmonic distortions on the CW signal.

The tones of the response signal are, for example, created by intermodulation and can comprise the sum, difference and/or harmonics of the supplied CW tones. For instance, a tone of the response signal can be based on a respective CW tone of the CW signal, wherein signal parameters, such as phase, signal strength or bandwidth, of the response signal tone can be modified and/or distorted compared to the CW signal tone depending on the DUT.

The parallel processing unit may comprise a parallel processing path for a separate and parallel processing of the IF tones from the RF signal source and response signal from the DUT. For example, the parallel processing unit can perform measurements of the phase differences between the respective CW and IF tones.

In an embodiment, the RF signal source is a direct digital synthesis, DDS, capable signal source. In particular, the RF signal source is configured to generate a multi-tone signal with an accurate and stable frequency offset between the tones.

The DDS capable source can be configured to create the CW signal digitally using a numerically controlled oscillator. For instance, the DDS capable source can change the frequency of a generated signal in one clock cycle. A network analyzer using such a DDS capable source can have a reduced phase noise compared to other types of RF sources due to its continuous and repeatable phase.

The DDS capable source and ADC converters can be clocked in a coherent manner such that a stable phase relationship between the CW signal and the IF signal can be established.

In an embodiment, the system further comprises a display which is configured to display the at least one scattering parameter.

In an embodiment, the measurement performed on the at least two CW tones and the at least two IF tones comprises at least one ratio measurement. For instance, three ratio measurements between three CW tones and three corresponding IF tones are performed.

In an embodiment, the RF signal source is configured to adapt the phases of the at least two CW tones to reduce a crest factor of the CW tones. In this way, for example, a ratio of a signal peak to the root-mean-square (RMS) of the tones can be reduced. This can facilitate a measurement that is performed on an active DUT.

In particular, the crest factor refers to a ratio of a peak value to an effective value of a waveform, typically a normalized waveform. For instance, the crest factor of a waveform consisting of multiple sinusoidal tones is expressed as a ratio of the peak amplitude of the time-domain waveform to the mean amplitude of the waveform.

In an embodiment, the measurement system comprises multiple output ports, and the RF signal source is configured to feed the CW signal to more than one output port.

In an embodiment, the CW signal has at least three CW tones, and the response signal from the DUT has at least three tones which are based on the at least three CW tones. This provides the advantage that the at least scattering parameter of the DUT can be calculated efficiently based on three or more different tones.

In particular, the conversion unit converts the at least three tones of the response signal to at least three IF tones, and the parallel processing unit performs the measurement on the at least three CW tones and at least three IF tones.

In an embodiment, the measurement system is a vector network analyzer.

According to a second aspect, the present disclosure relates to a measurement method for a parallel measurement with multiple tones, comprising:
  generating a continuous wave, CW, signal having at least two CW tones;
  feeding said CW signal to an output port which is arranged for being connected to a device-under-test, DUT;
  receiving a response signal from the DUT at an input port, the response signal having at least two tones which are based on the at least two CW tones;
  converting the response signal to an intermediate frequency, IF, signal by means of analog mixing, thereby converting the at least two tones of the response signal to at least two IF tones;
  converting the IF signal to a digital signal using an analog-to-digital converter;
  isolating the at least two IF tones of the IF signal using a digital down conversion, DDC, technique; and
  performing a measurement on the at least two CW tones and the at least two IF tones to determine at least one scattering parameters of the DUT.

In particular, the mathematically-defined CW waveform (CW signal) can be used as the reference signal against which the response signal is measured for s-parameter based ratio measurements.

In an embodiment, the measurement method further comprises the step of:
  displaying the at least one scattering parameter.

In an embodiment, the measurement performed on the at least two CW tones and the at least two IF tones comprises at least one ratio measurement.

In an embodiment, the measurement method further comprises the step of:
  adapting the phases of the at least two CW tones to reduce a crest factor of the CW tones.

In an embodiment, the CW signal is fed to more than one output port.

In an embodiment, the CW signal has at least three CW tones, and the response signal from the DUT has at least three tones which are based on the at least three CW tones. This provides the advantage that the at least scattering parameter of the DUT can be calculated efficiently based on three or more different tones.

BRIEF DESCRIPTION OF THE DRAWINGS

The above described aspects and implementation forms of the present disclosure will be explained in the following description of specific embodiments in relation to the enclosed drawings, in which.

DETAILED DESCRIPTIONS OF EMBODIMENTS

Figure 1A:
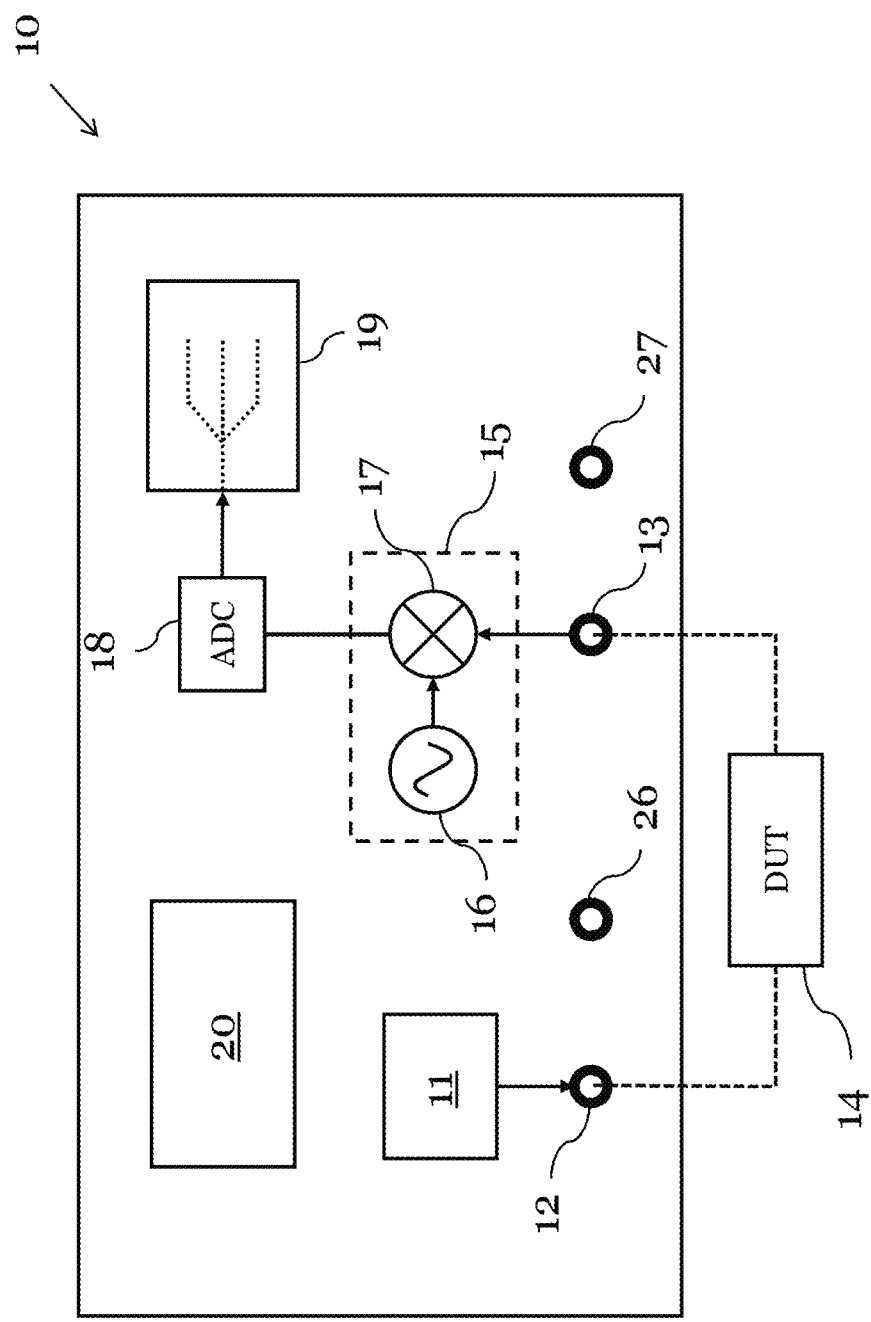
FIG. 1A shows a schematic diagram of a measurement system for a parallel measurement with multiple tones according to an embodiment.

FIG. 1A shows a schematic diagram of a measurement system 10 for a parallel measurement with multiple tones according to an embodiment.

The measurement system 10 comprises an RF signal source 11 being configured to generate a continuous wave (CW) signal having at least two CW tones, the RF signal source 11 being configured to feed said CW signal to an output port 12 of the measurement system 10 which is arranged for being connected to a device-under-test (DUT) 14. The measurement system 10 further comprises an input port 13 being arranged to receive a response signal from the DUT 14, the response signal having at least two tones which are based on the at least two CW tones, a conversion unit 15 being configured to convert the response signal to an intermediate frequency (IF) signal by means of analog mixing, thereby converting the at least two tones of the response signal to at least two IF tones and an analog-to-digital converter 18 being configured to convert the IF signal to a digital signal. The measurement system 10 further comprises a parallel processing unit 19 being configured to isolate the at least two IF tones of the IF signal, thereby, for instance, using a digital down conversion (DDC) technique. The parallel processing unit 19 is configured to perform one or more measurements on the at least three CW tones and the at least two IF tones to determine at least one scattering parameter of the DUT 14.

Preferably, the CW signal comprises three or more CW tones, and the response signal from the DUT comprises three or more tones based on the three or more CW tones. The conversion unit 15 may convert the three or more tones of the response signal to three or more IF tones, and the parallel processing unit 19 may performs the measurement on the three or more CW tones and the three or more IF tones.

The measurement system 10 can be measurement instrument, such as a vector network analyzer (VNA). In particular, the measurement system 10 comprises a housing, wherein the components of the system 10 are housed in the housing. The measurement system 10 may further comprise an optional display 20 for displaying the at least one scattering parameter of the DUT 14.

The RF signal source 11 can be a direct digital synthesis capable signal source (DDS source). Thereby, the DDS source 11 can be configured to generate the signal digitally using a numerically controlled oscillator and, subsequently, converting the digitally generated signal into an analog signal using a digital-to-analog converter. In this way, the RF signal source 11 can be configured to generate a multi-tone CW signal with full control of the phase of each CW tone of the CW signal.

The RF signal source 11 can be configured to adapt the phases of the at least two CW tones such that a crest factor of the CW tones is reduced. For example, the ratio of peak value to the root mean square value of the CW tones can be minimized. By reducing the crest factor a signal's instantaneous peak power can be reduced. For instance, a maximum crest factor for a three tone signal is 4.78 db and a minimum crest factor is 2.3 db. A maximum crest factor for a four tone signal is, for instance, 6 db.

The CW signal comprising the at least two CW tones can be generated by the RF signal source 11 in any suitable way. For example, the RF signal source 11 can be configured to generate the CW signal as a multi-tone signal by generating an RF signal with a carrier frequency and applying an amplitude modulation to the RF signal in order to generate at least two group delay signals having frequencies that are symmetrical to the frequency of the RF signal. The group delay signals can be the sideband signals generated due to the amplitude modulation of the RF signal generated at a certain carrier frequency. For example, the amplitude modulation can be performed by an attenuator or modulator. By generating two or more group delay signals via amplitude modulation, a multi-tone signal is provided, which can be fed to the DUT 14. Alternatively to the above, also other techniques to generate a multi-tone signal may be used.

The DUT 14 can be an RF equipment which is connected to the input and output ports 13, 12 of the measurement system 10. Thereby, the DUT 14 is not a component of the system 10 but an external device that is connected to the system 10 for testing. The DUT 14 can have an input port for receiving the CW signal and an output port for outputting the response signal. For instance, the DUT 14 is an active DUT, such as a signal amplifier, or a passive DUT, such as a RF connector, filter or cable. The DUT 14 can be connected to the input and output ports 13, 12 by means of a wired connection.

The DUT 14 can create the tones of the response signal by intermodulation of the received CW tones. For example, the tones of the response signal comprise the sum, difference and/or harmonics of the supplied CW tones. Alternatively or additionally, the tones of the response signals can be phase shifted relative to the supplied CW tones. The DUT 14 can be a non-linear DUT, which causes harmonic distortions on the CW signal.

The conversion unit 15 can comprise a mixer 17 and a local oscillator 16. The mixer 17 and local oscillator 16 can be configured to perform a down conversion of the response signal to the IF signal.

The conversion unit 15 can comprise a receiver connected to the input port for receiving the response signal. The conversion unit 15 can further comprise a directional coupler which can be arranged before the receiver.

The parallel processing unit 19 can be arranged to receive a digitalized IF signal comprising the at least two digitalized IF tones from the analog-to-digital converter 18. The parallel processing unit 19 may comprise a parallel processing path which allows parallel processing of the at least two digitalized IF tones. The parallel processing unit 19 can be configured to process the IF tones using a digital down conversion (DDC) technique. In particular, this DDC technique may comprise converting one or more of the IF tones to a lower frequency at a lower sampling rate, e.g. to a baseband signal. The parallel processing unit 19 may, therefore, comprise at least one DDC unit, the DDC unit comprising a direct digital synthesizer, a low-pass filter and a down sampler.

The measurements performed by the parallel processing unit 19 may comprise ratio measurements between the at least two CW tones and the at least two IF tones. Thereby, both the at least two CW tones and the at least two IF tones used to perform the measurement can be digitalized signal tones. For instance, the parallel processing unit 19 is configured to receive a digitalized CW signal comprising the CW tones from the RF signal source 11. The RF signal source 11 can be configured to generate the CW signal as digital signal (which is forwarded to the parallel processing unit 19) and to convert said digital signal to an analog signal that is fed to the DUT 14.

For example, the parallel processing unit 19 can be configured to measure phase differences between respective CW tones and IF tones to analyze phase shifts caused by the DUT on the CW signal.

In particular, the scattering parameters (s-parameters), which can be determined by the parallel processing unit 19, are parameters that describe the electrical behavior of the DUT 14 when receiving an RF signal. The scattering parameters can be determined as a function of frequency. For example, the scattering parameters of an amplifier may include information on, a complex linear gain, a scalar linear gain, a scalar logarithmic gain, insertion losses and/or input return losses of the amplifier. The scattering parameters can be expressed as elements of a scattering matrix.

The measurement system 10 may comprise a plurality of additional ports 26, 27, e.g. additional input and/or output ports. The RF signal source 11 can be configured to feed the CW signal to any number of output ports (N-ports) of the system 10.

Figure 1B:
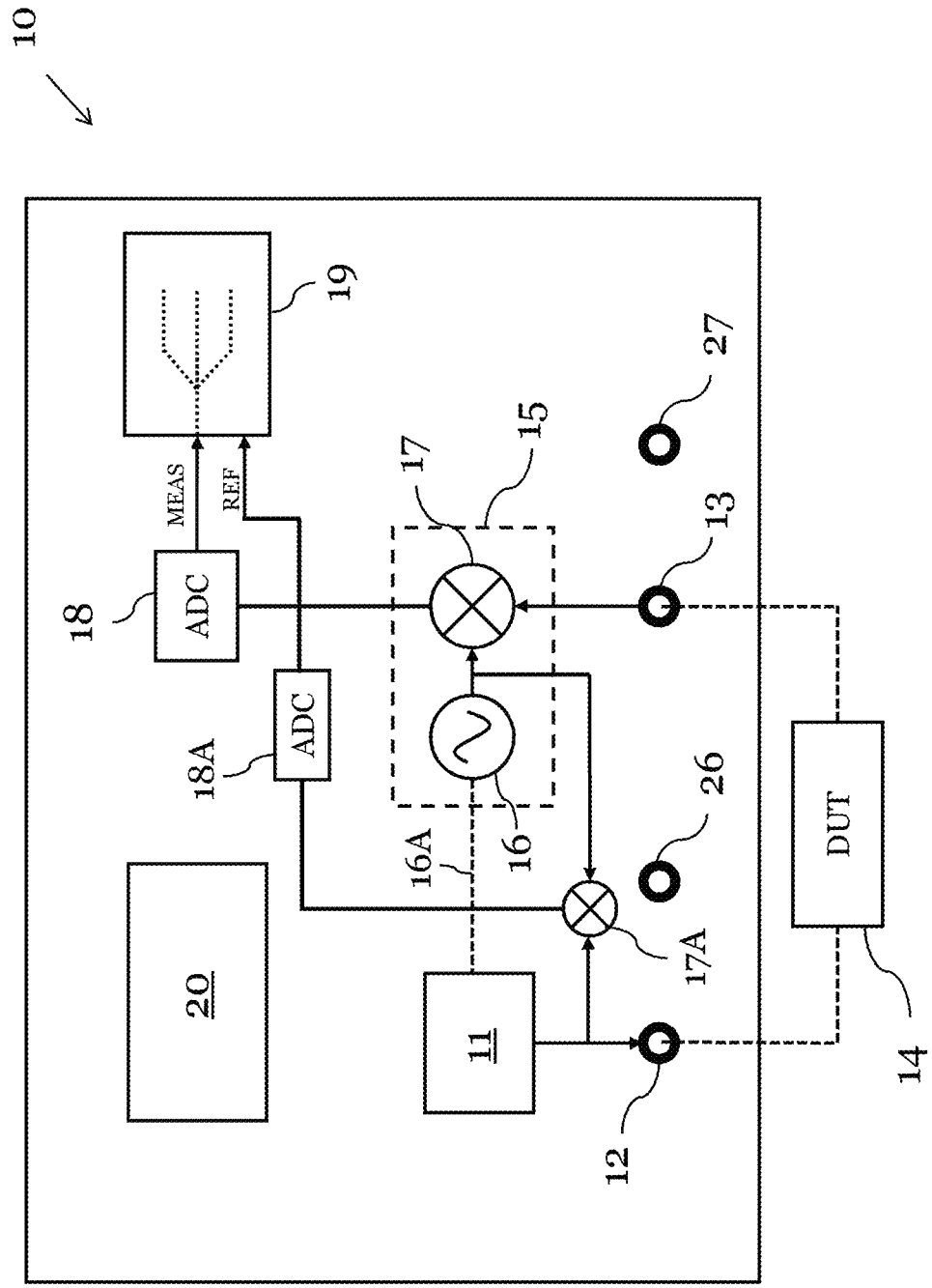
FIG. 1B shows a schematic diagram of a measurement system for a parallel measurement with multiple tones according to an embodiment.

FIG. 1B shows a schematic diagram of the measurement system 10 for a parallel measurement with multiple tones according to another embodiment.

The RF signal source 11 in FIG. 1B may receive a reference timing signal 16A which ensures that the RF signal source 11 is coherent with the IF signals and parallel processing unit 19, so that a stable phase relationship between the DUT input and output can be established.

Furthermore, FIG. 1B shows how a reference signal (e.g., the CW signal from the signal source 11) can be forwarded to the parallel processing unit 19, e.g. via a mixer 17A and a further ADC converter 18A. In this way, the parallel processing unit 19 can be supplied with both a digital IF signal and a digitalized CW signal. In particular, the mathematically-defined CW waveform (CW signal) can be used as the reference signal against which the response signal is measured for s-parameter based ratio measurements.

In particular, to determine amplitude and phase relationship between an input and an output of the DUT 14, the CW signal can be compared to the IF signal in the parallel processing unit 19 in two ways: (i) an "ideal" waveform can be generated in the DDS generator, which can be used as the reference signal against which the measured IF signal is compared, or (ii) sampling of the DDS generator RF signal can be performed using conventional analog mixing to obtain a lower IF frequency and then digital down-conversion to baseband.

Figure 2:
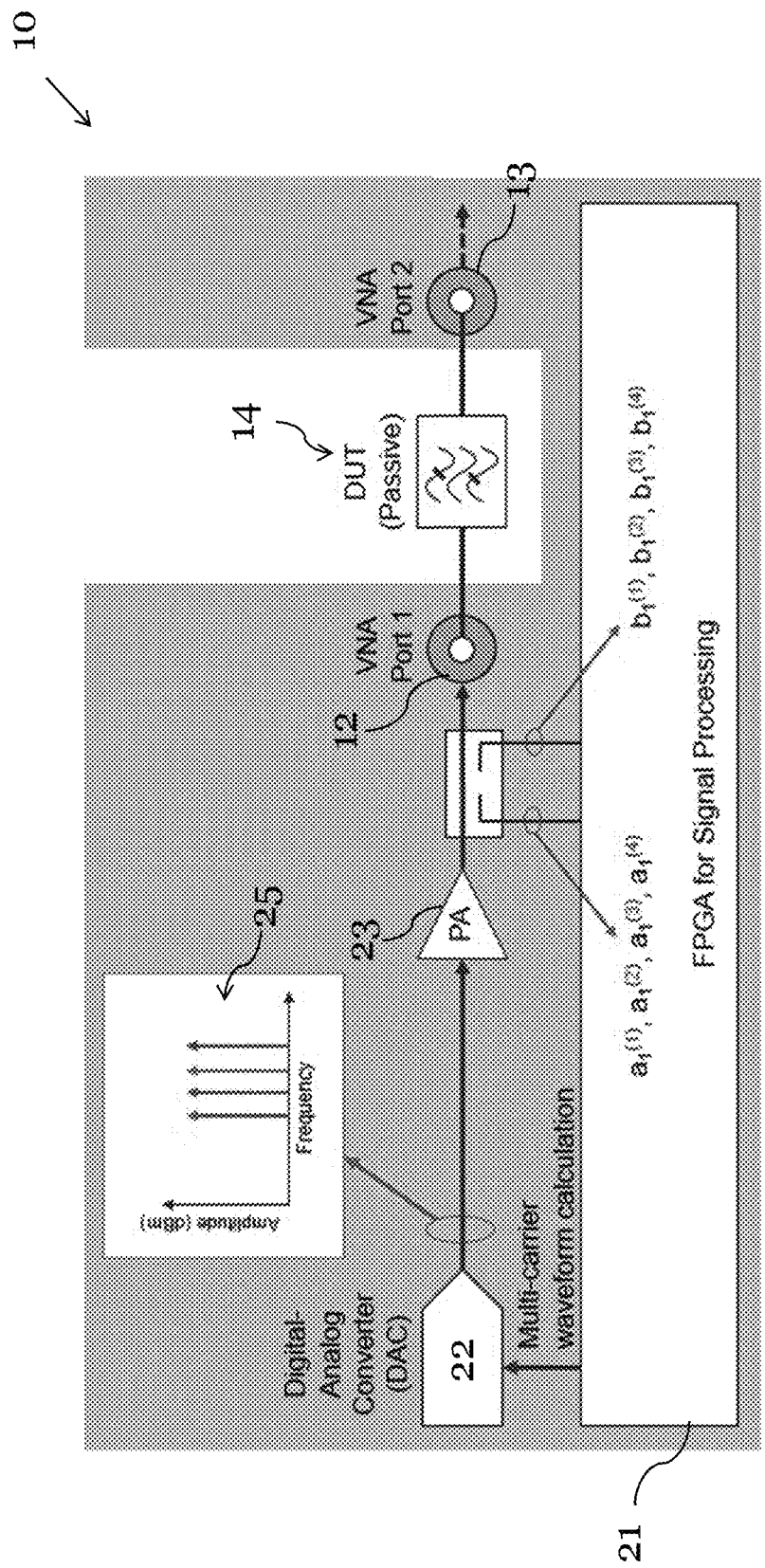
FIG. 2 shows a schematic diagram of a measurement system for a parallel measurement with multiple tones according to an embodiment.

FIG. 2 shows a schematic diagram of the measurement system 10 for a parallel measurement with multiple tones according to another embodiment. The measurement system 10 shown in FIG. 2 is, for instance, a vector network analyzer (VNA).

The measurements system 10 shown in FIG. 2 comprises an integrated circuit 21, e.g. a field-programmable gate array, and a digital-to-analog converter 22. The RF signal source 11 can be connected to or can comprise the integrated circuit 21 and/or the digital-to-analog converter 22 to generate the CW signal 25. In particular, the integrated circuit 21 and the digital-to-analog converter 22 are configured to generate the CW signal based on a DDS technique with the integrated circuit 21 providing a multi-carrier waveform calculation to the digital-to-analog converter 22. FIG. 2 shows an example CW signal 25 having four CW tones.

The measurements system can further comprise a power amplifier 23 which is configured to amplify the CW signal. The digital-to-analog converter 22 can be arranged to feed the analog CW signal to the power amplifier 23.

The integrated circuit 21 can further be connected to a signal path of the CW signal, e.g. for receiving and/or adapting the CW signal prior to forwarding the CW signal to the DUT 14 via the output port 12.

In particular, the RF signal source 11, the conversion unit 15 and/or the parallel processing unit 19 of FIG. 1A or 1B can be at least partially implemented by the integrated circuit 21 of FIG. 2.

Figure 3:
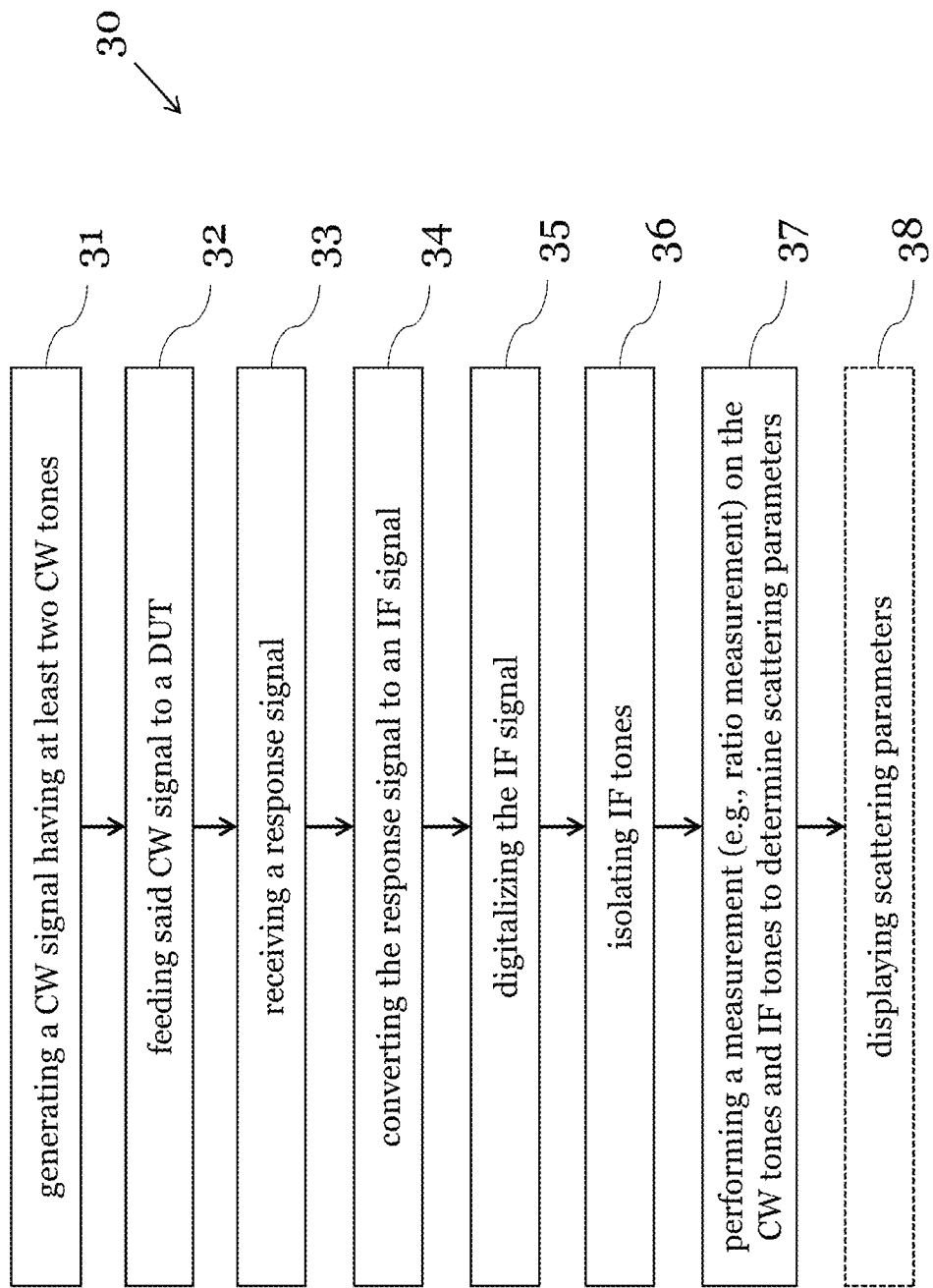
FIG. 3 shows a flow diagram of a measurement method for a parallel measurement with multiple tones according to an embodiment.

FIG. 3 shows a flow diagram of a measurement method 30 for a parallel measurement with multiple tones according to an embodiment.

The measurement method 30 comprises the steps of: generating 31 the CW signal having at least two CW tones; feeding 32 said CW signal to the output port which is arranged for being connected to the DUT 14; receiving 33 the response signal from the DUT 14 at the input port, the response signal having at least two tones which are based on the at least two CW tones; converting 34 the response signal to the IF signal by means of analog mixing, thereby converting the at least two tones of the response signal to the at least two IF tones; converting 35 the IF signal to the digital signal using the analog-to-digital converter 18; isolating 36 the at least two IF tones of the IF signal, for instance, by using a DDC technique; and performing 37 the measurement on the at least two CW tones and the at least two IF to determine at least one scattering parameters of the DUT 14.

For instance, the method 30 can be performed by any one of the measurements systems 10 shown in FIG. 1A, 1B or 2.

In particular, by combining the multi-tone CW signal generator with a DDC, the measurement time can be improved by a factor of two (for two-tone measurements) or by a factor of four (for four-tone measurements) stimulus. In this way, the fundamental bottleneck of irreducible IF BW filter sampling time can be avoided by processing multiple "streams" in parallel.

The method 30 may further comprise the optional step of displaying 38 the scattering parameters.

In particular, the measurement performed on the at least two CW tones and the at least two IF tones comprises at least one ratio measurement.

The step of feeding 32 the CW signal to an output port may comprise feeding the CW signal to a plurality of output ports (N-ports).

Figure 4:
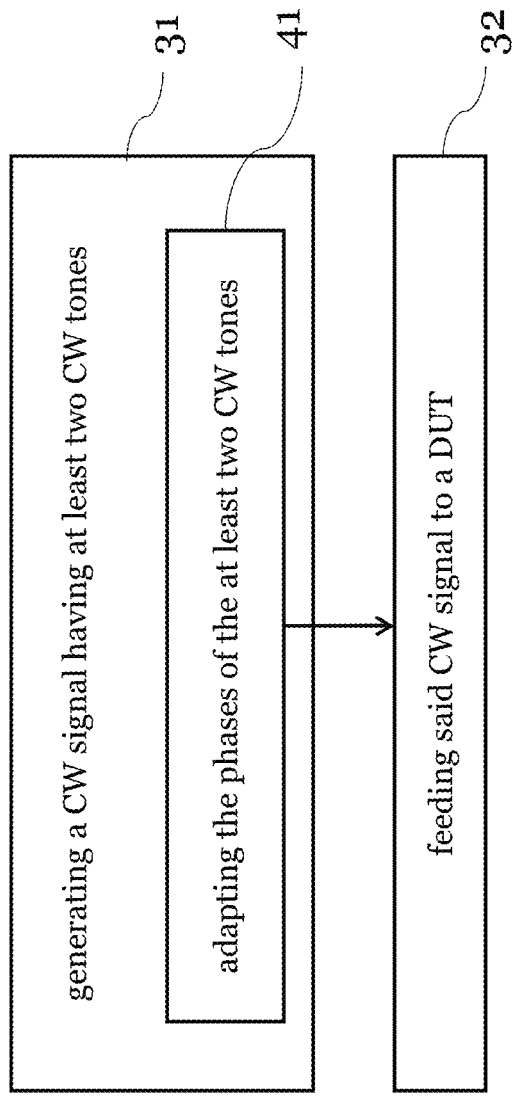
FIG. 4 shows a flow diagram of a step of the measurement method shown in FIG. 3 according to an embodiment.

FIG. 4 shows a flow diagram of a step 31 of the measurement method 30 shown in FIG. 3 according to an embodiment. According to FIG. 4 the step of generating 31 the CW signal may comprise the sub-step of adapting 41 the phases of the at least two CW tones, for instance, to reduce a crest factor of the CW tones. Said CW signal with adapted phases can then be fed to the DUT 14.

All features of all embodiments described, shown and/or claimed herein can be combined with each other.

The invention claimed is:

1. A measurement system for a parallel measurement with multiple tones, comprising:

an RF signal source being configured to generate a continuous wave, CW, signal having at least two CW tones, the RF signal source being configured to feed said CW signal to an output port of the measurement system which is arranged for being connected to a device-under-test, DUT;

an input port being arranged to receive a response signal from the DUT, the response signal having at least two tones which are based on the at least two CW tones;

a conversion unit being configured to convert the response signal to an intermediate frequency, IF, signal by means of analog mixing, thereby converting the at least two tones of the response signal to at least two IF tones;

an analog-to-digital converter being configured to convert the IF signal to a digital signal;

a parallel processing unit being configured to isolate the at least two IF tones of the IF signal using a digital down conversion, DDC, technique;

the parallel processing unit being further configured to perform a measurement on the at least two CW tones and the at least two IF tones to determine at least one scattering parameter of the DUT, wherein the measurement system comprises multiple output ports, and wherein the RF signal source is configured to feed the CW signal to more than one output port.

2. The measurement system of claim 1,
wherein the RF signal source is a direct digital synthesis, DDS, capable signal source.

3. The measurement system of claim 1, further comprising
a display which is configured to display the at least one scattering parameter.

4. The measurement system of claim 1,
wherein the measurement performed on the at least two CW tones and the at least two IF tones comprises at least one ratio measurement.

5. The measurement system of claim 1,
wherein the RF signal source is configured to adapt the phases of the at least two CW tones to reduce a crest factor of the CW tones.

6. The measurement system of claim 1,
wherein the CW signal has at least three CW tones, and wherein the response signal from the DUT has at least three tones which are based on the at least three CW tones.

7. The measurement system of claim 1,
wherein the measurement system is a vector network analyzer.

8. A measurement method for a parallel measurement with multiple tones, comprising:

generating a continuous wave, CW, signal having at least two CW tones;

feeding said CW signal to an output port which is arranged for being connected to a device-under-test, DUT;

receiving a response signal from the DUT at an input port, the response signal having at least two tones which are based on the at least two CW tones;

converting the response signal to an intermediate frequency, IF, signal by means of analog mixing, thereby converting the at least two tones of the response signal to at least two IF tones;

converting the IF signal to a digital signal using an analog-to-digital converter;

isolating the at least two IF tones of the IF signal using a digital down conversion, DDC, technique; and performing a measurement on the at least two CW tones and the at least two IF tones to determine at least one scattering parameters of the DUT, wherein the CW signal is fed to more than one output port.

9. The measurement method of claim 8, further comprising:

displaying the at least one scattering parameter.

10. The measurement method of claim 8, wherein the measurement performed on the at least two CW tones and the at least two IF tones comprises at least one ratio measurement.

11. The measurement method of claim 8, further comprising adapting the phases of the at least two CW tones to reduce a crest factor of the CW tones.

12. The measurement method of claim 8, wherein the CW signal has at least three CW tones, and wherein the response signal from the DUT has at least three tones which are based on the at least three CW tones.

* * * * *